(12) United States Patent
Weis et al.

(10) Patent No.: US 9,530,764 B2
(45) Date of Patent: *Dec. 27, 2016

(54) SEMICONDUCTOR ARRANGEMENT WITH ACTIVE DRIFT ZONE

(71) Applicant: Infineon Technologies Dresden GmbH, Dresden (DE)

(72) Inventors: Rolf Weis, Dresden (DE); Michael Treu, Villach (AT); Gerald Deboy, Klagenfurt (AT); Armin Willmeroth, Augsburg (DE); Hans Weber, Bayerisch Gmain (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/372,774

(22) PCT Filed: Jan. 30, 2013

(86) PCT No.: PCT/EP2013/051827
§ 371 (c)(1),
(2) Date: Jul. 17, 2014

(87) PCT Pub. No.: WO2013/113771
PCT Pub. Date: Aug. 8, 2013

(65) Prior Publication Data
US 2015/0041915 A1    Feb. 12, 2015

Related U.S. Application Data

(63) Continuation of application No. 13/362,038, filed on Jan. 31, 2012, now Pat. No. 8,866,253.

(51) Int. Cl.
*H01L 27/00* (2006.01)
*H01L 27/02* (2006.01)
(Continued)

(52) U.S. Cl.
CPC ........... *H01L 27/0207* (2013.01); *H01L 21/84* (2013.01); *H01L 21/845* (2013.01); *H01L 27/06* (2013.01);
(Continued)

(58) Field of Classification Search
CPC ............................. H01L 27/0207; H01L 27/06
(Continued)

(56) References Cited

U.S. PATENT DOCUMENTS 4,317,055 A    2/1982 Yoshida
4,367,421 A    1/1983 Baker
(Continued)

FOREIGN PATENT DOCUMENTS

DE            3100795 A1    8/1982
DE            3335475 A1    5/1985
(Continued)

*Primary Examiner* — Thomas L Dickey
(74) *Attorney, Agent, or Firm* — Murphy, Bilak & Homiller, PLLC

(57) ABSTRACT

A semiconductor device arrangement includes a first semiconductor device having a load path and a plurality of second semiconductor devices, each having a load path between a first and a second load terminal and a control terminal. The second semiconductor devices have their load paths connected in series and connected in series to the load path of the first semiconductor device. Each of the second semiconductor devices has its control terminal connected to the load terminal of one of the other second semiconductor devices, and one of the second semiconductor devices has its control terminal connected to one of the load terminals of the first semiconductor device. Each of the second semiconductor devices has at least one device characteristic. At least one device characteristic of at least one of the second semiconductor devices is different from the corresponding device characteristic of others of the second semiconductor devices.

22 Claims, 8 Drawing Sheets

(51) Int. Cl.

| | | |
|---|---|---|
| *H01L 21/84* | (2006.01) | |
| *H01L 27/06* | (2006.01) | |
| *H01L 27/088* | (2006.01) | |
| *H01L 27/12* | (2006.01) | |
| *H03K 17/06* | (2006.01) | |
| *H03K 17/10* | (2006.01) | |
| *H01L 29/423* | (2006.01) | |
| *H01L 29/78* | (2006.01) | |

(52) U.S. Cl.
CPC ......... *H01L 27/0629* (2013.01); *H01L 27/088* (2013.01); *H01L 27/0886* (2013.01); *H01L 27/1211* (2013.01); *H01L 29/4236* (2013.01); *H01L 29/78* (2013.01); *H03K 17/063* (2013.01); *H03K 17/102* (2013.01)

(58) Field of Classification Search
USPC ............................ 257/337, 339, 499, 529, E27.033, 257/E29.312
See application file for complete search history.

(56) References Cited

U.S. PATENT DOCUMENTS

| | | | |
|---|---|---|---|
| 4,459,498 A | 7/1984 | Stengl et al. | |
| 4,468,686 A | 8/1984 | Rosenthal | |
| 4,487,458 A | 12/1984 | Janutka | |
| 4,893,070 A | 1/1990 | Milberger et al. | |
| 5,285,369 A | 2/1994 | Balakrishnan | |
| 5,557,127 A | 9/1996 | Ajit et al. | |
| 6,304,094 B2 | 10/2001 | Gilliam | |
| 6,365,930 B1 * | 4/2002 | Schillaci | H01L 27/088 257/339 |
| 6,504,697 B1 | 1/2003 | Hille | |
| 6,888,396 B2 | 5/2005 | Hajimiri et al. | |
| 6,914,297 B2 | 7/2005 | Deboy et al. | |
| 8,455,948 B2 | 6/2013 | Weis | |
| 8,569,842 B2 | 10/2013 | Weis et al. | |
| 8,866,253 B2 * | 10/2014 | Weis | H03K 17/063 257/499 |
| 2003/0071320 A1 | 4/2003 | Kocon | |
| 2003/0168919 A1 | 9/2003 | Friedrichs et al. | |
| 2004/0089896 A1 | 5/2004 | Sakakibara | |
| 2006/0098365 A1 | 5/2006 | Harris et al. | |
| 2010/0032671 A1 | 2/2010 | Marshall | |
| 2010/0078694 A1 | 4/2010 | Willmeroth et al. | |
| 2010/0078707 A1 | 4/2010 | Haeberlen et al. | |
| 2010/0079191 A1 | 4/2010 | Deboy | |
| 2010/0301403 A1 * | 12/2010 | Min | H01L 29/0619 257/316 |
| 2012/0175634 A1 | 7/2012 | Weis | |
| 2012/0175635 A1 * | 7/2012 | Weis | H01L 27/0623 257/77 |

FOREIGN PATENT DOCUMENTS

| | | |
|---|---|---|
| DE | 19745040 A1 | 8/1998 |
| DE | 10234493 B3 | 2/2004 |
| DE | 102007013848 A1 | 9/2008 |
| DE | 102009029694 A1 | 4/2010 |
| EP | 140349 A2 | 5/1985 |
| EP | 2521259 A2 | 11/2012 |
| JP | 57048828 A | 3/1982 |
| JP | 60093820 A | 5/1985 |
| JP | 2004521585 A | 7/2004 |
| JP | 2004247496 A | 9/2004 |
| JP | 2006324626 A | 11/2006 |
| JP | 2007242719 A1 | 9/2007 |
| JP | 2009037936 A | 2/2009 |
| WO | 9501667 | 1/1995 |
| WO | 2012093177 A2 | 7/2012 |

* cited by examiner

SEMICONDUCTOR ARRANGEMENT WITH ACTIVE DRIFT ZONE

Embodiments of the present invention relate to a semiconductor arrangement, and particularly to a semiconductor arrangement with a first semiconductor device and with a plurality of second semiconductor devices connected in series.

One important aim in the development of power semiconductor devices, such as power transistors or power diodes, is to produce devices with a high voltage blocking capability but, nevertheless, a low on-resistance ($R_{ON}$), and with low switching losses.

Power transistors usually include a drift region arranged between a body region and a drain region and doped lower than the drain region. The on-resistance of a conventional power transistor is dependent on the length of the drift region in a current flow direction and on the doping concentration of the drift region, wherein the on-resistance decreases when the length of the drift region is reduced or when the doping concentration in the drift region is increased. However, reducing the length of the region or increasing the doping concentration reduces the voltage blocking capability.

One possible way to reduce the on-resistance of a power transistor having a given voltage blocking capability is to provide compensation regions in the drift region, wherein the compensation regions are doped complementary to the drift region. Another possible way is to provide field plates in the drift region which are dielectrically insulated from the drift region and which are, for example, connected to a gate or source terminal of the transistor. In these types of power transistors, the compensation zones or the field plates partly "compensate" doping charges in the drift region when the component is in its off-state. This allows to provide a higher doping of the drift region—which reduces the on-resistance without reducing the voltage blocking capability.

A power diode (pin diode) usually includes a low doped drift or base region between a first emitter region of a first doping type and a second emitter region of a second doping type. A power diode is configured to block when a voltage with a first polarity (blocking voltage) is applied between the first and second emitter regions, and is configured to conduct a current when a voltage with a second polarity is applied between the first and second emitter regions. In the conducting state, however, a charge carrier plasma with charge carriers of the first and second type (p-type and n-type charge carriers) is generated in the base region. The amount of charge carrier plasma stored in the base region is dependent on a length of the base region and is, therefore, dependent on the voltage blocking capability, where the amount of charge carrier plasma increases when the voltage blocking capability increases. This charge carrier plasma has to be removed before the diode may block upon applying a blocking voltage.

These known devices, however, have a high output capacitance which may result in a time delay when the device changes the operation state from an on-state to an off-state and vice versa. Thus, the problem is to provide a semiconductor arrangement acting like a power semiconductor device with a high voltage blocking capability, a low on-resistance and a low output capacitance. This problem is solved by semiconductor arrangements of claims 1, 14 and 19. Specific embodiments are disclosed in the subclaims.

A first embodiment relates to a semiconductor device arrangement. The semiconductor device arrangement includes a first semiconductor device having a load path, and a plurality of second semiconductor devices, each having a load path between a first and a second load terminal and a control terminal. The second semiconductor devices have their load paths connected in series and connected in series to the load path of the first semiconductor device, each of the second semiconductor devices has its control terminal connected to the load terminal of one of the other second semiconductor devices, and one of the second semiconductor devices has its control terminal connected to one of the load terminals of the first semiconductor device. Further, each of the second semiconductor devices has at least one device characteristic, and at least one device characteristic of at least one of the second semiconductor devices is different from the corresponding device characteristic of others of the second semiconductor devices.

A second embodiment relates to a semiconductor device arrangement. The semiconductor device arrangement includes a first semiconductor device having a load path, a plurality of second transistors, each having a load path between a first load terminal and a second load terminal and a control terminal. The second transistors have their load paths connected in series and connected in series to the load path of the first semiconductor device, and the series circuit with the first semiconductor device and the second transistors are connected between a first load terminal and a second load terminal of the semiconductor device arrangement. The semiconductor device arrangement further includes a tap of the series circuit, the tap located between the load paths of two of the second transistors, and a third load terminal coupled to the tap.

A third embodiment relates to a semiconductor device arrangement. The semiconductor device arrangement includes at least two series circuits connected in parallel. Each series circuit includes a first semiconductor device having a load path and a control terminal, a plurality of second semiconductor devices, each having a load path between a first and a second load terminal and a control terminal. The semiconductor device arrangement further includes a drive terminal. At least one resistor is connected between the control terminal of the first semiconductor device of one series circuit and the drive terminal, and the second semiconductor devices of each series circuit have their load paths connected in series and connected in series to the load path of the first semiconductor device, Each of the second semiconductor devices of each series circuit has its control terminal connected to the load terminal of one of the other second semiconductor devices, and one of the second semiconductor devices of each series circuit has its control terminal connected to one of the load terminals of the first semiconductor device.

Those skilled in the art will recognize additional features and advantages upon reading the following detailed description, and upon viewing the accompanying drawings.

Examples will now be explained with reference to the drawings. The drawings serve to illustrate the basic principle, so that only aspects necessary for understanding the basic principle are illustrated. The drawings are not to scale. In the drawings the same reference characters denote like features.

Figure 12:
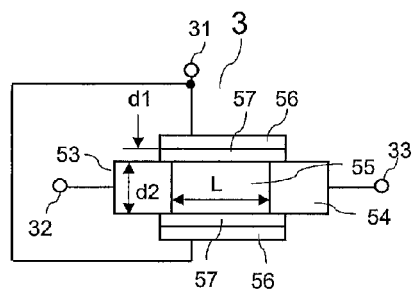

FIG. 12 schematically illustrates the implementation of one second transistor as a depletion MOSFET.

Figures 1, 3:
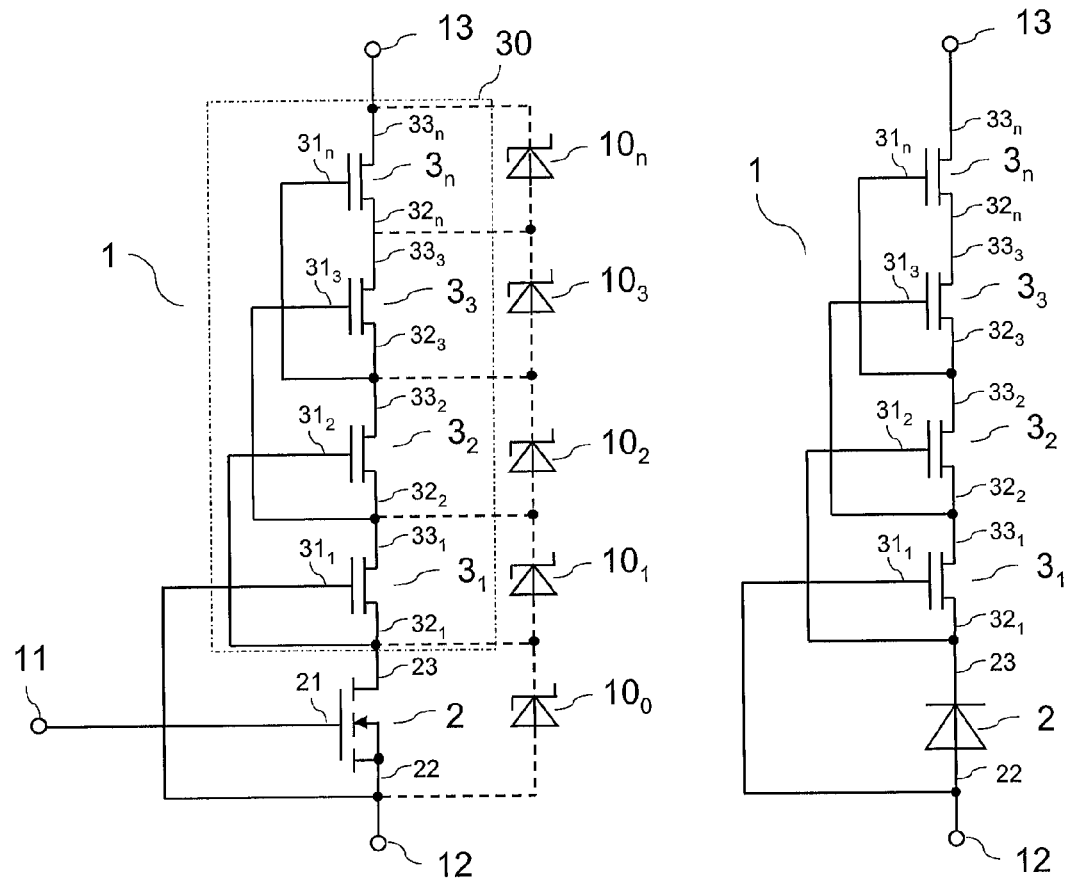
FIG. 1 illustrates a semiconductor arrangement with a first semiconductor device implemented as a transistor and with a plurality of second semiconductor devices connected in series with each other and connected in series with the first semiconductor device.
FIG. 3 illustrates a semiconductor arrangement with a first semiconductor device implemented as a diode and with a plurality of second semiconductor devices connected in series with each other and connected in series with the first semiconductor device.
Figure 13:
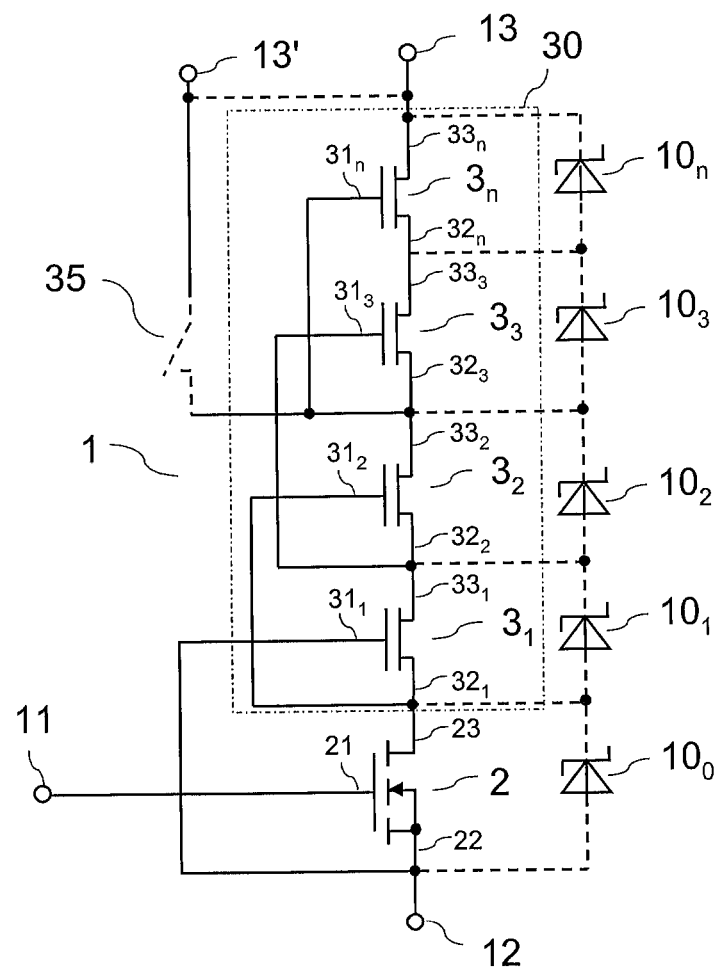

FIG. 13 illustrates a modification of the circuit arrangement of FIG. 1.

Figures 14A, 14B, 14C:
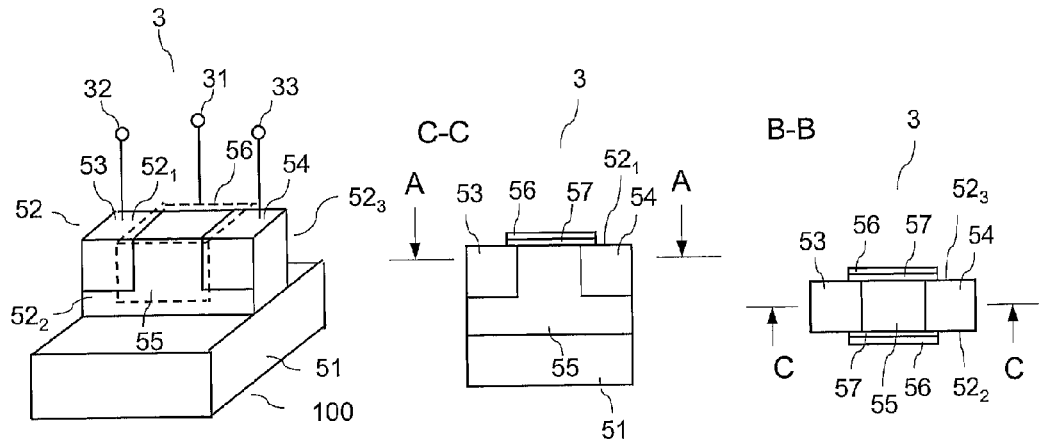

FIG. 14 that includes FIGS. 14A to 14C illustrates a first embodiment of one second semiconductor device implemented as FINFET.

Figures 15A, 15B, 15C:
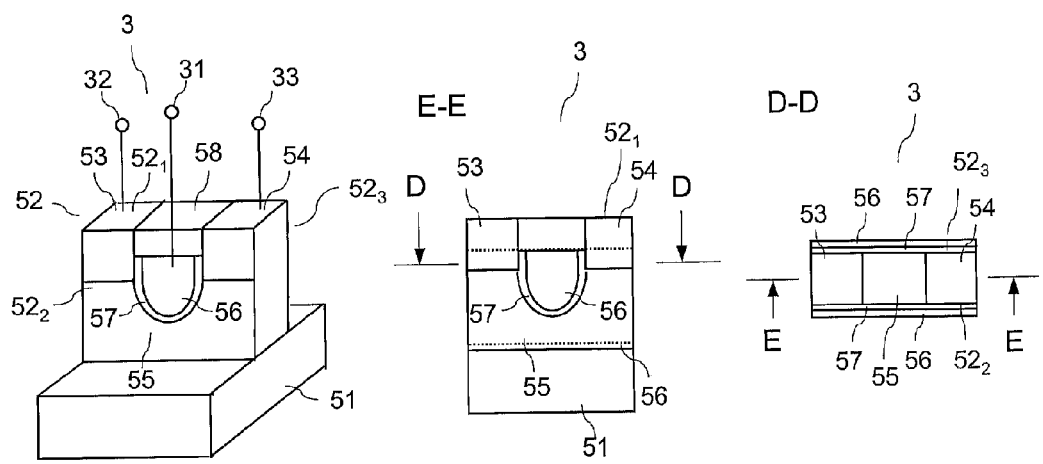

FIG. 15 that includes FIGS. 15A to 15C illustrates a second embodiment of one second semiconductor device implemented as FINFET.

Figure 16:
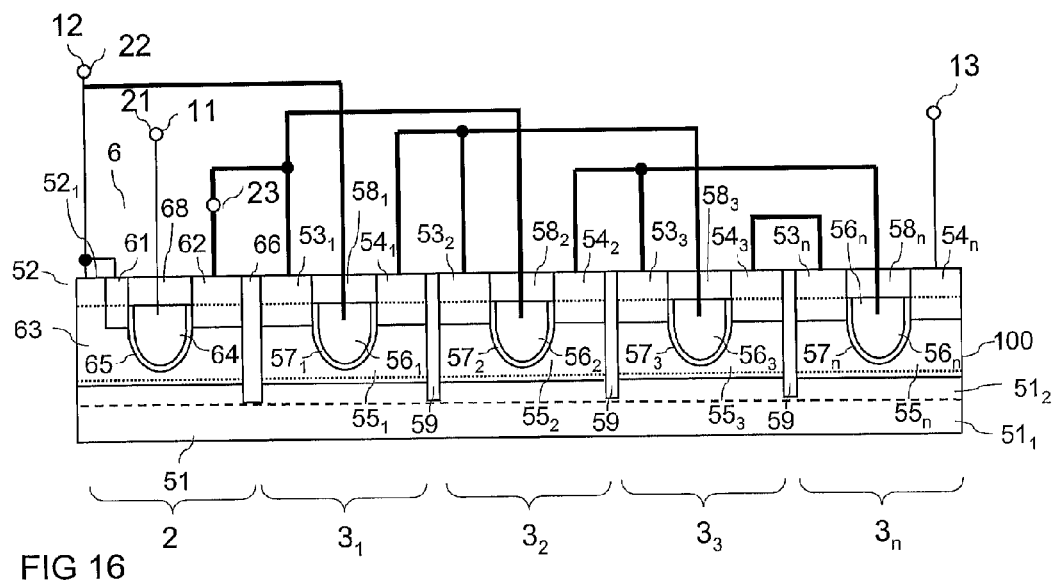

FIG. 16 illustrates a vertical cross sectional view of a semiconductor body according to a first embodiment in which a first semiconductor device and a plurality of second semiconductor devices are implemented in one semiconductor fin.

Figure 17:
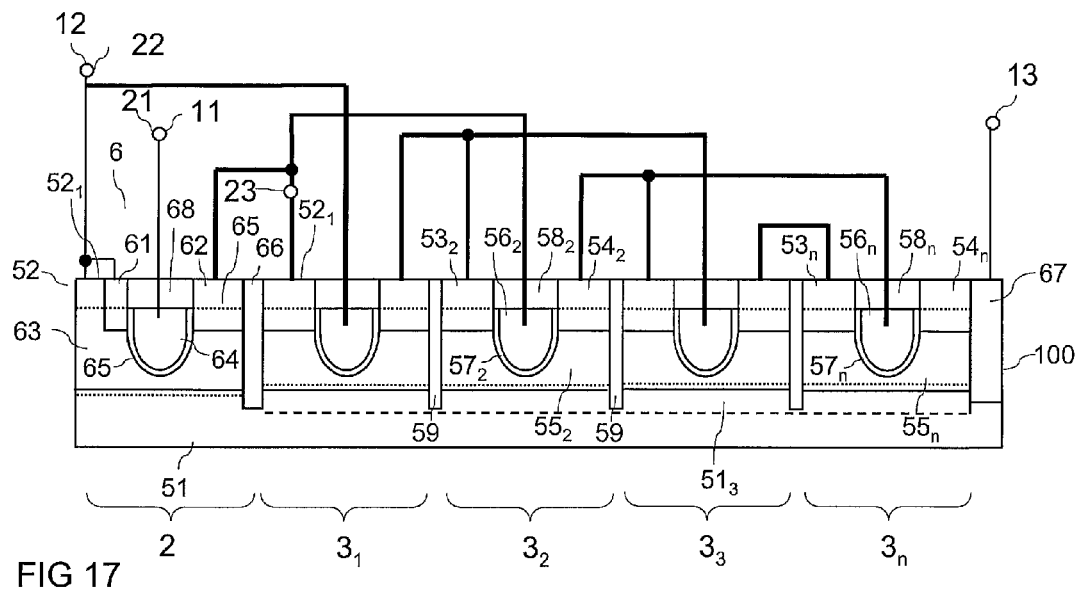

FIG. 17 illustrates a vertical cross sectional view of a semiconductor body according to a second embodiment in which a first semiconductor device and a plurality of second semiconductor devices are implemented in one semiconductor fin.

Figure 18:
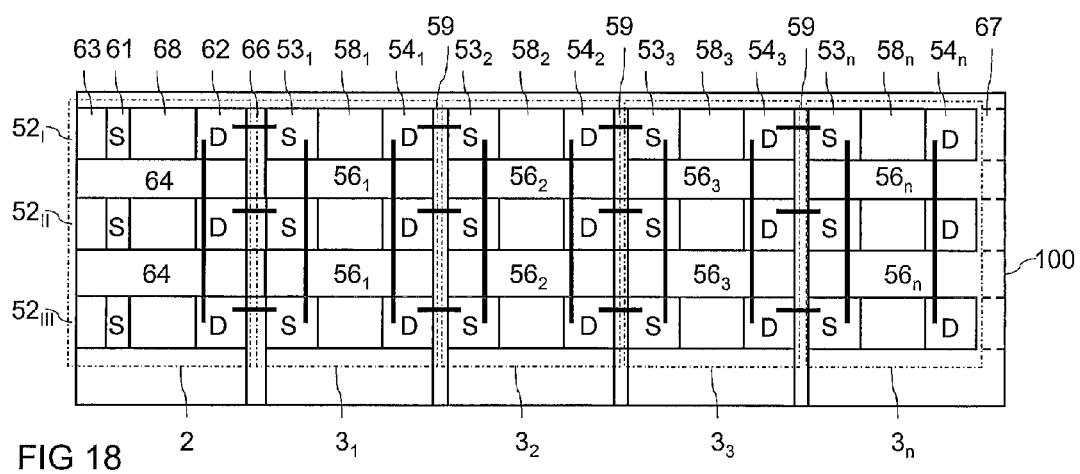

FIG. 18 illustrates a top view of a semiconductor body according to a third embodiment in which a first semiconductor device and a plurality of second semiconductor devices each including several FINFET cells are implemented.

Figure 19:
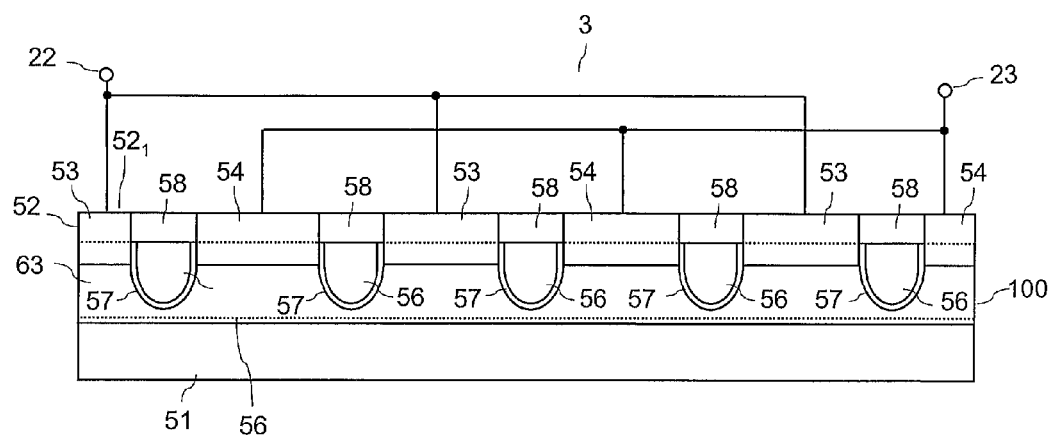

FIG. 19 illustrates a vertical cross sectional view of one second semiconductor device including several FINFET cells connected in parallel.

Figure 20A:
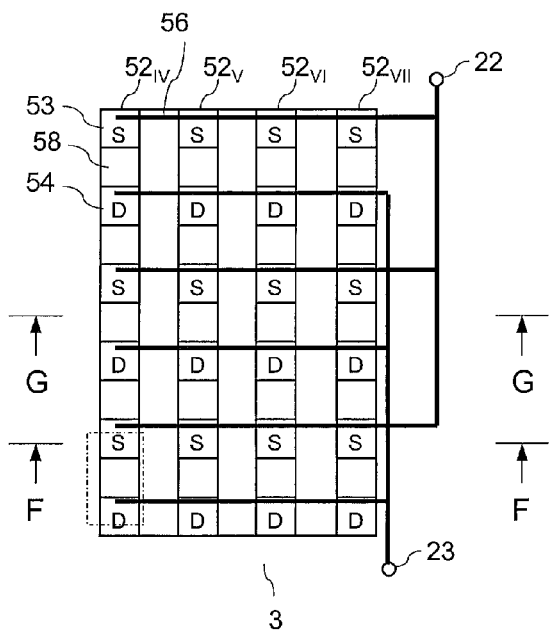
Figure 20B:
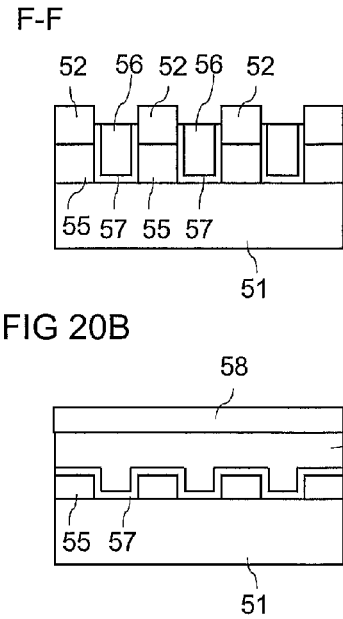
Figure 20C:
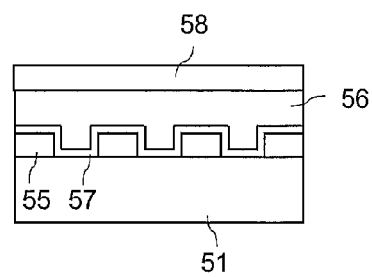

FIG. 20 that includes FIGS. 20A to 20C illustrates a further embodiment of one second semiconductor device including several FINFET cells connected in parallel.

Figure 21:
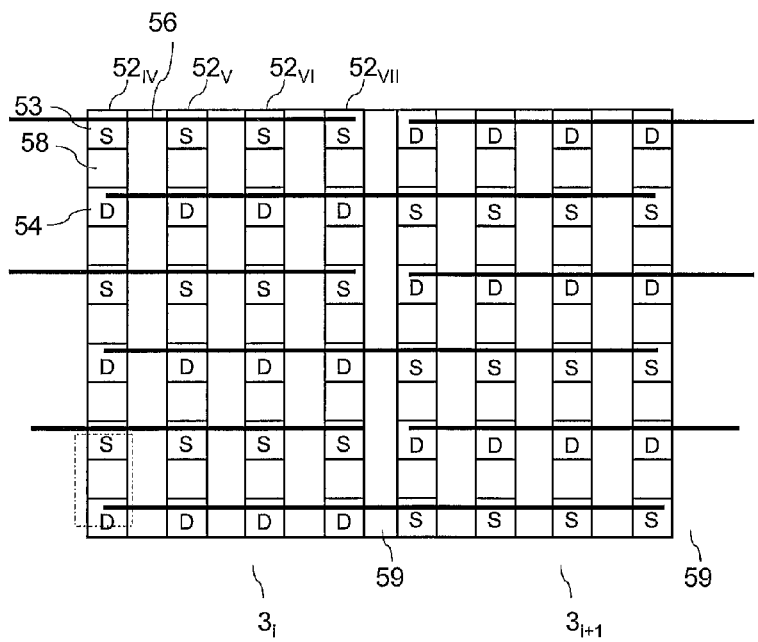

FIG. 21 illustrates two second semiconductor devices of the type illustrated in FIG. 20 connected in series.

Figure 22:
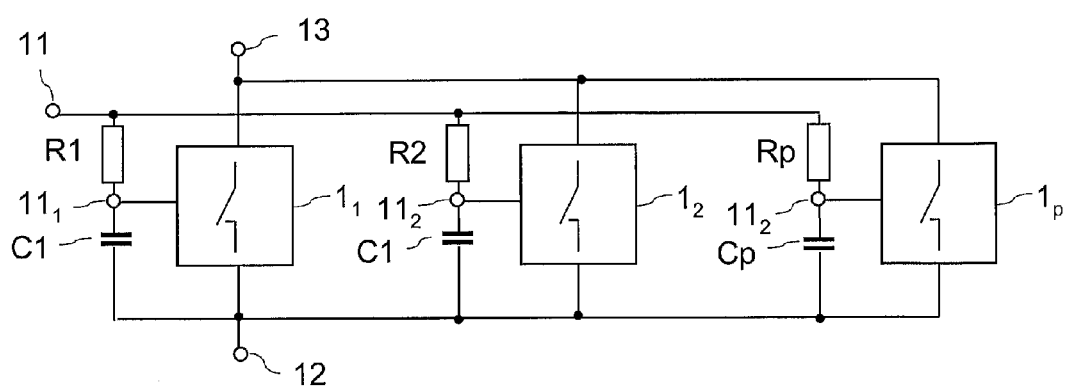

FIG. 22 illustrates a further embodiment of the semiconductor arrangement.

In the following Detailed Description, reference is made to the accompanying drawings, which form a part thereof, and in which is shown by way of illustration specific embodiments in which the invention may be practiced. It is to be understood that the features of the various exemplary embodiments described herein may be combined with each other, unless specifically noted otherwise.

FIG. 1 illustrates a first embodiment of a semiconductor arrangement 1 that includes a first semiconductor device 2 and a plurality of second semiconductor devices $3_1$-$3_n$. The first semiconductor device 2 has a load path between a first load terminal 22 and a second load terminal 23 and can assume an on-state, in which the load path conducts a current, or an off-state, in which the load paths blocks. The first semiconductor device 2 according to FIG. 1 is implemented as a transistor and further includes a control terminal 21. Specifically, the first semiconductor device 2 according to FIG. 1 is implemented as a MOSFET where the control terminal 21 is a gate terminal and the first and second load terminals 22, 23 are source and drain terminals, respectively.

In FIG. 1 as well as in the following figures reference number "3" followed by a subscript index denotes the individual second semiconductor devices. Same parts of the individual second semiconductor devices, such as control terminals and load terminals, have the same reference character followed by a subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistors in the embodiment illustrated in FIG. 1 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of an adjacent second transistor. Further, the load paths of the second transistors 3 are connected in series with the load path 22-23 of the first semiconductor device 2, so that the first semiconductor device 2 and the plurality of second transistors 3 form a cascode-like circuit.

Referring to FIG. 1, there are n second transistors 3, with n>1. From these n second transistors 3, a first one of the second transistors $3_1$ is the second transistor that is arranged closest to first semiconductor device 2 in the series circuit with the n second transistors 3 and has its load path $32_1$-$33_1$ directly connected to the load path 22-23 of the first semiconductor device 2. An n-th one of the second transistors $3_n$ is the second transistor that is arranged most distant to first semiconductor device 2 in the series circuit with the n second transistors 3. In the embodiment illustrated in FIG. 1, there are n=4 second transistors 3. However, this is only an example, the number n of second transistors 3 can be selected arbitrarily, namely dependent on a desired voltage blocking capability of the semiconductor device arrangement 1. This is explained in greater detail herein below.

Each of the second semiconductor devices 3 has its control terminal 31 connected to one of the load terminals of another one of the second semiconductor devices 3 or to one of the load terminals of the first semiconductor device 2. In the embodiment illustrated in FIG. 1, the 1st second transistor $3_1$ has its control terminal $31_1$ connected to the first load terminal 22 of the first semiconductor device 2. Each of the other second transistors $3_2$-$3_{n-1}$ have their control terminal $31_2$-$31_n$ connected to the first load terminal $32_1$-$32_3$ of the second transistor that is adjacent in the series circuit in the direction of the first semiconductor device 2. Assume, for explanation purposes, that $3_i$ is one of the second transistors $3_2$-$3_n$ other than the first transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ of the lower second transistor $3_{i-1}$ to which the control terminal of the upper second transistor $3_i$ is connected to is not directly connected to one of the load terminals $32_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal $31_i$ of the second transistor $3_i$ is connected to the first load terminal $32_{i-2}$ of the second transistor $3_{i-2}$ that is two second transistors away from the second transistor $3_i$ in the direction of the first semiconductor device 2 in the series circuit.

Referring to FIG. 1, the first semiconductor device 2 and the second transistors 3 can be implemented as MOSFETs (metal-oxide-semiconductor field-effect transistors). Each of these MOSFETs has a gate terminal as a control terminal 21, 31, a source terminal as a first load terminal 22, 32, and a drain terminal as a second load terminal 23, 33. MOSFETs are voltage controlled devices that can be controlled by the voltage applied between the gate and source terminals (the control terminal and the first load terminal). Thus, in the arrangement illustrated in FIG. 1, the 1st second transistors $3_1$ is controlled through a voltage that corresponds to the load path voltage of the first semiconductor device 2, and the other second transistors $3_i$ are controlled through the load path voltage of at least one second transistor $3_{i-1}$ or $3_{i-2}$. The "load path" voltage of one MOSFET is the voltage between the first and second load terminals (drain and source terminals) of this MOSFET.

In the embodiment illustrated in FIG. 1, the first semiconductor device 2 is a normally-off (enhancement) transistor, while the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors.

Implementing the first semiconductor device 2 and the second transistors 3 as MOSFETs is only an example. Any type of transistor can be used to implement the first semiconductor device 2 and the second transistors 3, such as a MOSFET, a MISFET (metal-insulator-semiconductor field-effect transistor), a MESFET (metal semiconductor field effect transistor), an IGBT (insulated gate bipolar transistor), a JFET (junction gate field-effect transistor), a FINFET (fin FET), a nanotube device, an HEMT (high electron mobility transistor), etc. Independent of the type of device used to implement the first semiconductor device 2 and the second semiconductor devices 3, these devices are connected such that each of the second transistors 3 is controlled by the load path voltage of at least one other second transistor 3 or the first semiconductor device 2 in the series circuit.

The semiconductor device arrangement 1 with the first semiconductor device 2, implemented as transistor, and the second transistors 3 can be switched on and off like a conventional transistor by applying a suitable drive voltage to the first semiconductor device 2. The control terminal 21 of the first semiconductor device 2 forms a control terminal 11 of the overall arrangement 1, and the first load terminal 21 of the first semiconductor device 2 and the second load terminal of the n-th second transistor $3_n$ form the first and second load terminals 12, 13, respectively, of the overall arrangement 1.

Figure 2:
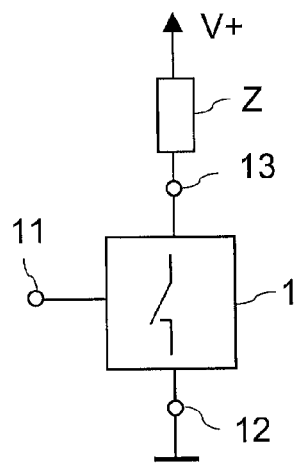
FIG. 2 illustrates the application of a semiconductor arrangement of FIG. 1 as an electronic switch for switching a load.

FIG. 2 illustrates the use of the semiconductor device arrangement 1 as an electronic switch for switching a load Z. The load path of the semiconductor arrangement 1, which is path between the first and second load terminals 12, 13 is connected in series with the load. The series circuit with the semiconductor device arrangement 1 and the load Z is connected between terminals for a first (positive) and a second (negative) supply potential V+, GND.

The operating principle of the semiconductor arrangement 1 is explained in the following. For explanation purposes only it is assumed that the first semiconductor device 2 is implemented as an n-type enhancement MOSFET, that the second transistors 3 are implemented as n-type depletion MOSFETs or n-type JFETs, and that the individual devices 2, 3 are interconnected as illustrated in FIG. 1. The basic operating principle, however, also applies to semiconductor device arrangements implemented with other types of first and second semiconductor devices.

It is commonly known that depletion MOSFETs or JFETs, that can be used to implement the second transistors 3, are semiconductor devices that are in an on-state when a drive voltage (gate-source voltage) of about zero is applied, while MOSFETs or JFETs are in an off-state when the absolute value of the drive voltage is higher than a pinch-off voltage of the device. The "drive voltage" is the voltage between the gate terminal and the source terminal of the device. In an n-type MOSFET or JFET the pinch-off voltage is a negative voltage, while the pinch-off voltage is a positive voltage in a p-type MOSFET or JFET.

When a (positive) voltage is applied between the second and first load terminals 13, 12 and when the first semiconductor device 2 is switched on by applying a suitable drive potential to the control terminal 11, the 1st second transistor $3_1$ is conducting (in an on-state), the absolute value of the voltage across the load path 22-23 of the first semiconductor device 2 is too low so as to pinch-off the 1st second transistor $3_1$. Consequently, the 2nd second transistor $3_2$ controlled by the load path voltage of the 1st second transistor $3_1$ is also starting to conduct, etc. In other words, the first semiconductor device 2 and each of the second transistors 3 are finally conducting so that the semiconductor arrangement 1 is in an on-state. When the semiconductor arrangement 1 is in an on-state and when the semiconductor device 2 is switched off, the voltage drop across the load path of the first semiconductor device 2 increases, so that the 1st second transistor $3_1$ starts to switch off when the absolute value of the load-path voltage reaches the pinch-off voltage of the 1st of the second transistors 3. When a positive voltage is applied between the second load terminal 13 and the first load terminal 12 of the overall arrangement 1, the voltage between the second load terminal 23 and the first load terminal 22 of the first semiconductor device 2 is also a positive voltage when the first semiconductor device 2 switches off. In this case, the gate-source voltage of the 1st second transistor $3_1$ is a negative voltage suitable to pinch this transistor $3_1$ off.

When the 1st second transistor $3_1$ is switched off, the voltage drop across its load path increases so that the 2nd second transistor $3_2$ is switched off, which in turn switches off the 3rd second transistor $3_3$, and so on, until each of the second transistors 3 is switched off and the semiconductor device arrangement 1 is finally in a stable off-state. The external voltage applied between the second and first terminals 13 and 12 switches as many of the second transistors 3 from the on-state to the off-state as required to distribute the external voltage over the first semiconductor device 2 and the second transistors 3. When applying a low external voltage, some second transistors 3 are still in the on-state, while others are in the off-state. The number of second transistors 2 that are in the off-state increases as the external voltage increases. Thus, when a high external voltage is applied, that is in the range of the voltage blocking capability of the overall semiconductor device arrangement 1, the first semiconductor device 2 and each of the second transistors 3 are in the off-state.

When the semiconductor device arrangement 1 is in an off-state and when the first semiconductor device 2 is switched on, the voltage drop across the load path of the first semiconductor device 2 decreases so that it switches on the 1st second transistor $3_1$, which in turn switches on the 2nd second transistor $3_2$, and so on. This continues until each of the second transistors 3 is again switched on.

The switching states of the second transistors 3 connected in series with the first semiconductor device 2 are dependent on the switching state of the first semiconductor device 2 and follow the switching state of the first semiconductor device 2. Thus, the switching state of the semiconductor arrangement 1 is defined by the switching state of the first semiconductor device 2. The semiconductor arrangement 1 is in an on-state when the first semiconductor device 2 is in an on-state, and the semiconductor arrangement 1 is in an off-state when the first semiconductor device 2 is in an off-state.

The semiconductor arrangement 1 has a low resistance between the first and second load terminals 12, 13 when it is in an on-state, and has a high resistance between the first and second load terminals 12, 13 when it is in an off-state. In the on-state, an ohmic resistance between the first and second load terminals 12, 13 corresponds to the sum of the on-resistances $R_{ON}$ of the first semiconductor device 2 and the second transistors 3. A voltage blocking capability, which is the maximum voltage that can be applied between the first and second load terminals 12, 13 when the semiconductor arrangement 1 is in an off-state before an avalanche breakthrough sets in, corresponds to the sum of the voltage blocking capabilities of the first semiconductor device 2 and the second transistors 3. The first semiconductor device 2 and the individual second transistors 3 may have relatively low voltage blocking capabilities, such as voltage blocking capabilities of between 3V and 50V. However, dependent on the number n of second transistors 3 a high overall voltage blocking capability of up to several 100V, such as 600V or more, can be obtained.

The voltage blocking capability and the on-resistance of the semiconductor arrangement 1 are defined by the voltage blocking capabilities of the first semiconductor device 2 and the second transistors 3 and by the on-resistances of the first semiconductor device 2 and the second transistors 3, respectively. When significantly more than two second transistors 3 are implemented (n>>2), such as more than 5, more than 10, or even more than 20 second transistors 3 are implemented, the voltage blocking capability and the on-resistance of the semiconductor arrangement 1 are mainly defined by the arrangement 30 with the second transistors 3. The overall semiconductor arrangement 1 can be operated like a conventional power transistor, where in a conventional power transistor, an integrated drift region mainly defines the on-resistance and the voltage blocking capability. Thus, the arrangement 30 with the second transistors 3 has a function that is equivalent to the drift region in a conventional power transistor. The arrangement 30 with the second transistors 30 therefore is also referred to herein as active drift region (ADR). The overall semiconductor device arrangement 1 of FIG. 1 can be referred to as ADZ transistor or ADR transistor (ADZ transistor) or as ADRFET (ADZFET), when the first semiconductor device 2 is implemented as a MOSFET.

When the semiconductor device arrangement 1 is in an off-state, the voltage applied between the first and second load terminals 12, 13 is distributed such that a part of this voltage drops across the load path 22-23 of the first semiconductor device 2, while other parts of this voltage drop across the load paths of the second transistors 3. However, there may be cases in which there is no equal distribution of this voltage to the second transistors 3. Instead, those second transistors 3 that are closer to the first semiconductor device 2 may have a higher voltage load than those second transistors 3 that are more distant to the first semiconductor device 2.

In order to more equally distribute the voltage to the second transistors 3, the semiconductor arrangement 1 optionally includes voltage limiting means $10_1$-$10_n$ that are configured to limit or clamp the voltage across the load paths of the second transistors 3. Optionally, a clamping element $10_0$ is also connected in parallel to the load path (between the source and drain terminals) of the first semiconductor device 2. The voltage clamping means $10_0$-$10_n$ can be implemented in many different ways. For illustration purposes only the clamping means $10_0$-$10_n$ illustrated in FIG. 1 can include Zener diodes $10_0$-$10_n$, with each Zener diode $10_0$-$10_n$ being connected in parallel with the load path of one of the second transistors 3 and, optionally, the first semiconductor device 2.

Instead of the Zener diodes $10_0$-$10_n$, tunnel diodes, PIN diodes, avalanche diodes, or the like, may be used as well. According to a further embodiment (not illustrated), the individual clamping elements $10_0$-$10_n$ are implemented as transistors, such as, for example, p-type MOSFETs when the second transistors 3 are n-type MOSFETs. Each of these clamping MOSFETs has its gate terminal connected to its drain terminal, and the load path (the drain-source path) of each MOSFET is connected in parallel with the load path of one second transistor 3.

The individual clamping elements, such as the Zener diodes $10_0$-$10_n$ illustrated in FIG. 1 can be integrated in the same semiconductor body as the first semiconductor device 2 and the second transistors 3. However, these clamping elements could also be implemented as external devices arranged outside the semiconductor body.

FIG. 3 illustrates a further embodiment of a semiconductor device arrangement 1. In the arrangement of FIG. 3, the first semiconductor device 2 is implemented as a diode with an anode terminal forming the first load terminal 21 and a cathode terminal forming a second load terminal. The operating principle of the semiconductor arrangement 1 of FIG. 3 corresponds to the operating principle of the semiconductor arrangement 1 of FIG. 1 with the difference that an on-state (forward biased state) and an off-state (reverse biased) state of the diode cannot be controlled via a control terminal (like in the transistor according to FIG. 1), but is controlled by the polarity of the voltage applied between the second and first load terminals 23, 22. The semiconductor arrangement 1 of FIG. 3, when implemented with n-type depletion MOSFET or n-type JFET as the second transistors 3, is in an on-state when a positive voltage is applied between the first and second load terminals 13, 12 of the semiconductor arrangement 1, and the semiconductor arrangement 1 of FIG. 3 is in an off-state when a negative voltage is applied between the first and second load terminals 13, 12 of the semiconductor arrangement 1. Everything else that has been explained with reference to the semiconductor arrangement 1 of FIG. 1 applies to the semiconductor arrangement 1 with the diode 2 of FIG. 3 accordingly. The semiconductor arrangement 1 with the diode according to FIG. 3 can be used like a conventional (high voltage) diode.

In the following, when a differentiation between the first semiconductor device 2 and the second semiconductor devices (second transistors) 3 is not required, the first semiconductor device 2 and the second transistors 3 will simply be referred to as "devices".

The second transistors 3 each have at least one device characteristic that defines or influences the operation or switching behavior of the individual transistor. When the second transistors 3 are, for example, implemented as MOSFET, possible device characteristics are the gate resistance, the threshold voltage, the gate-source capacitance, the gate-drain capacitance, the drain-source capacitance, the channel width, the thickness of the gate dielectric, or the doping concentration of a source region, a body region or a drain region. These device characteristics are explained in further detail below.

According to one embodiment, at least one device characteristic of at least one of the second semiconductor devices 3 is different from the corresponding device characteristic of others of the second semiconductor devices 3. By variation of the device characteristics of the individual second semiconductor devices 3, the switching behavior of the overall semiconductor device arrangement 1 can be adjusted and adopted to specific needs.

According to one embodiment, the at least one device characteristic that is varied is the gate resistance. Thus there is at least one second transistor 3 that has a gate resistance that is different from the gate resistances of others of the second transistors 3 and that is, in particular, higher than the gate resistance of others of the second transistors 3. In connection with the gate resistance, but also in connection with other device characteristics explained below, "different" means significantly different, so that differences resulting from usual variations or fluctuations in the manufacturing process are not included. According to one embodiment, the device characteristic, e.g. the gate resistance, of one semiconductor device is considered different form the corresponding device characteristic of another semiconductor device when the ratio between the two device characteristics is at least 1.1, at least 2, at least 5, or at least 10.

It is commonly known that the gate resistance of a MOSFET defines the switching speed of the MOSFET. The switching speed is a measure how fast a MOSFET can change from an on-state to an off-state, or vice versa. It is commonly known that a MOSFET includes an internal gate capacitance (gate-source capacitance and gate-drain capacitance) that can be charged or discharged via the gate terminal of the MOSFET. The charging state of this gate capacitance defines the switching state (on or off) of the MOSFET. The gate resistance of the MOSFET is the electrical resistance between a terminal at which a drive potential for the MOSFET is available and the gate electrode of the MOSFET. In the semiconductor device arrangement 1 of FIG. 1 the terminals at which drive potentials for the gate electrodes of the individual second transistors 3 are available are the first load terminals (source terminals) 32 of other second transistors 3 or the first load terminal (source terminal) 21 of the first transistor 2, respectively. When there is a high gate resistance the gate capacitance can only be charged and discharged relatively slowly, so that the MOSFET switches relatively slowly from one switching state (on or off) to the other switching state (off or on). Thus, by increasing the gate resistance of at least one second transistor 3 relative to the gate resistances of other second transistors 3, the switching speed of the at least one second transistor can be slowed down relative to the switching speeds of the others of the second transistors. A reduction of the switching speed of individual second transistors 3 can be beneficial in different applications.

When, e.g., the semiconductor device arrangement 1 is implemented as a switch in a switching converter, such as a flyback converter, voltage overshoots may occur when the semiconductor device arrangement 1 is switched off. In the process of switching off the semiconductor device arrangement 1 the voltage between the first and second load terminals 12, 13 increases, wherein the rate at which the voltage increases is dependent on the switching speed of the individual second transistors 3 that, beginning with the 1st second transistor $3_1$ subsequently switch from the on-state to the off-state. Voltage overshoots can be prevented or at least reduced by reducing the switching speed of those second transistors 3 that switch off when the voltage between the first and second load terminals 12, 13 has already increased significantly. Assume, for example, that a maximum voltage of 520V is applied between the first and second load terminals 12, 13. At this maximum voltage the overshoots occur. In this case, the semiconductor device arrangement 1 can be implemented such that the gate resistance of those second transistors 3 is increased (relative to the gate resistance of other second transistors) that are switched off after the voltage between the first and second load terminals 12, 13 has increased to about 450V or, to be more general, has increased to about 80% or 85% of the maximum voltage. For explanation purposes it is assumed that the semiconductor device arrangement 1 has a voltage blocking capability of about 620V. In this case, the semiconductor device arrangement 1 may include one first transistor 2 and n=30 second transistors 3, where the second transistors 3 are implemented such that in the off-state of the semiconductor device arrangement 1 the first transistor 2 and each of the second transistors 3 have a load path voltage of about 20V. In this case, when the voltage between the first and second load terminals 12, 13 increases to 450V, the first transistor 2 and n=21 of the second transistors 3 are switched off. Thus, the switching speed of the second transistors $3_{n-9}$ to $3_n$ should be reduced in order to comply with the requirements explained before.

When, for example, the semiconductor device arrangement 1 is used as a switching element in a boost converter, such as a boost converter in a power factor correction (PFC) circuit that generates a DC link voltage of about 400V, the semiconductor device arrangement 1 is, for example, implemented such that the gate resistance of those second transistors 3 is increased that start to be switched off when the voltage between the first and second load terminals 12, 13 has increased to about 350V or, to about 90% of the maximum voltage. Thus, the switching speed of these transistors is reduced.

When, for example, the semiconductor device arrangement 1 is used as a switch in a half-bridge circuit that is part of an inverter receiving a DC link voltage of 400V, the semiconductor device arrangement 1 is, for example, implemented such that those second transistors 3 have an increased gate resistance that are switched off when the voltage between the first and second load terminals 12, 13 is between about 175V and 225V or between 45% and 55% of the maximum voltage. This is the voltage range in which the highest gradient of the load path voltage of the half bridge occurs, so that by slowing down the switching speed of those second transistors 3 that are switched off in this voltage range, the gradient of the load path voltage can be reduced.

The gate resistance of the at least one second transistor 3 that has a different gate resistance than others of the second transistors 3 can be adjusted, in particular increased, in many different ways. Some embodiments for adjusting the gate resistance or other device characteristics are explained with reference to figures below. In these figures, two second transistors $3_i$, $3_{i-1}$ connected in series are illustrated. Second transistor $3_i$, that will be referred to as upper transistor in the following, is controlled by the load path voltage of second transistor $3_{i-1}$, that will be referred to as lower transistor in the following. The gate terminal $31_i$ of the upper transistor $3_i$ is connected to the source terminal $32_{i-1}$ of the lower transistor $3_{i-1}$. At least one device characteristic of the upper transistor $3_i$ is different from the corresponding device characteristic of the lower second transistor $3_{i-1}$. The upper and lower transistor $3_i$, $3_{i-1}$ can be any pair of second transistors 3 in the series circuit. When the lower transistor $3_{i-1}$ is the first second transistor $3_1$, the first load terminal $32_1$ of this transistor $3_1$ is not connected to the second load terminal of another second transistor but is connected to the first load terminal 23 of the first semiconductor device 2.

Figure 4:
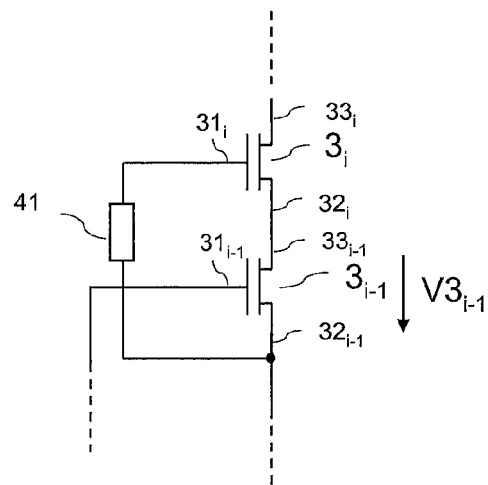
FIG. 4 illustrates a series circuit with two second transistors having different gate resistances according to a first embodiment.

FIG. 4 illustrates an embodiment for adjusting the gate resistance of the upper second transistor $3_i$. The gate resistance of the upper transistor $3_1$ is the electrical resistance between the internal gate electrode (not illustrated in FIG. 3) of the upper transistor $3_i$ and the first load terminal (source terminal) $32_{i-1}$ of the lower transistor $3_{i-1}$. This gate resistance is schematically illustrated by a resistor 41 in FIG. 4. The gate resistance 41 can be adjusted in many different ways. According to one embodiment, a resistive element 41 is connected in the connection line between the first load terminal $32_{i-1}$ and the gate terminal $31_i$. This connection line is, for example, a metal line, such as an aluminum line or a copper line. The resistive element 41 is, for example, implemented as a polysilicon resistor having a higher resistance than the connection line. According to a further embodiment, the contact resistance between the connection line and the individual terminals, which are the gate terminal $31_i$ and the second load terminal $32_{i-1}$, are increased in order to increase the gate resistance. The second load terminal $32_{i-1}$ electrically contacts the source region (not illustrated in FIG. 4) of the lower transistor. The source region of the lower transistor $3_{i-1}$ is a doped semiconductor region. Usually, a doped semiconductor region, such as a source region of a MOSFET, that is connected to a contact terminal, includes a higher doped contact region where the semiconductor region is contacted. The doping concentration of the contact region is, e.g. $1E20$ cm$^{-3}$ or higher. In order to increase the contact resistance, the doping concentration of the contact region can be reduced, or the contact region can be omitted. An ohmic contact is obtained between the contact terminal and contact region when the contact region has a high doping concentration. At lower doping concentrations, the contact can be a Schottky contact. Thus, according to one embodiment, the contact resistance between the source terminal $32_{i-1}$ and the source region of the lower transistor $3_{i-1}$ is increased by reducing the doping concentration of a contact region in the source region.

When the gate resistance of one second transistor 3, such as the upper second transistor $3_i$ of FIG. 4 is increased relative to the gate resistance of other second transistors 3, such as the lower second transistor $3_{i-1}$ of FIG. 4, the switching speed of the at least one transistor $3_i$ is reduced both, when switching the transistor $3_i$ on and when switching the transistor $3_i$ off.

Figure 5:
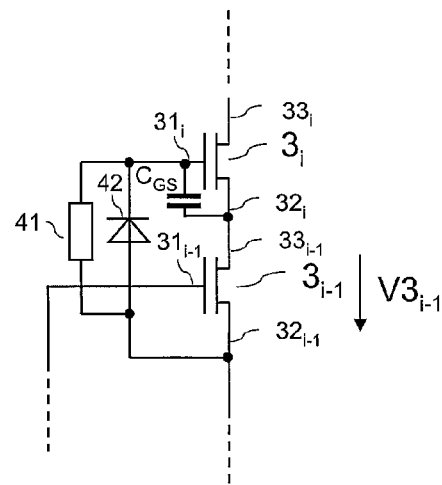
FIG. 5 illustrates a series circuit with two second transistors having different gate resistances according to a second embodiment.
Figure 6:
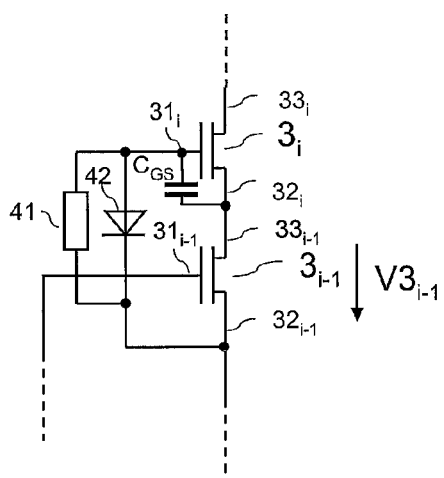
FIG. 6 illustrates a series circuit with two second transistors having different gate resistances according to a third embodiment.

According to further embodiments illustrated in FIGS. 5 and 6 a rectifier element 42, such as a pn-diode or a Schottky diode is connected in parallel with the additional gate resistance 41. The "additional gate resistance" is that part of the gate resistance added in order to influence the switching speed. Dependent on the polarity of the rectifier element the switching speed of the upper second transistor $3_i$ of FIG. 5 or 6 is reduced during switching on or during switching off. When the upper second transistor $3_i$ is switched off, its internal gate-source capacitance $C_{GS}$ that is schematically illustrated in FIG. 5A is charged to the voltage $V3_{i-1}$ across the load path of the lower second transistor $3_{i-1}$. When the lower second transistor $3_{i-1}$ is switched on, the gate-source capacitance $C_{GS}$ is discharged. In the present embodiment, in which the second transistors are n-type depletion transistors, the gate-source capacitance $C_{GS}$ can only be charged via the additional gate resistance 41 when the polarity of the rectifier element 42 is such that the cathode of the rectifier element 42 is connected to the gate terminal $31_i$ and the anode terminal is connected to the source terminal $32_{i-1}$ of the lower transistor $3_{i-1}$, like in FIG. 5. In this case, due to the fact, that the gate is charged to a negative potential, a positive current must flow from gate $31_i$ to source $32_{i-1}$ during switch-off of the upper transistor $3_i$. The switching speed of the upper transistor $3_i$ at switching off is reduced by the resistance, as the diode is in reverse bias, while the gate-source capacitance $C_{GS}$ can be rapidly discharged via the rectifier element 42 when the load path voltage $V_{i-1}$ of the lower transistor $3_{i-1}$ decreases in order to switch the upper transistor $3_i$ on. In case of switch on of the upper transistor $3_i$, the gate must be discharged, i.e. charged to a positive potential compared to the off-state. A positive current flows from source $32_{i-1}$ to $31_i$. As the current can flow thru the diode, the switching-on is fast. When the polarity of the rectifier element 42 is reversed, as illustrated in FIG. 6, the gate-source capacitance $C_{GS}$ can be rapidly charged via the rectifier element 42, but can only be discharged via the additional gate resistance. In this case, the switching speed of the upper second transistor $3_i$ is only reduced when the transistor $3_i$ is switched on.

A further device characteristic that influences the switching speed of the second transistors is the gate-source capacitance $C_{GS}$, that is schematically illustrated for the upper second transistor $3_i$ in FIGS. 5 and 6. Referring to the explanation herein before, the gate-source capacitance $C_{GS}$ is charged or discharged dependent on the desired switching state of the upper transistor $3_i$.

Figure 7:
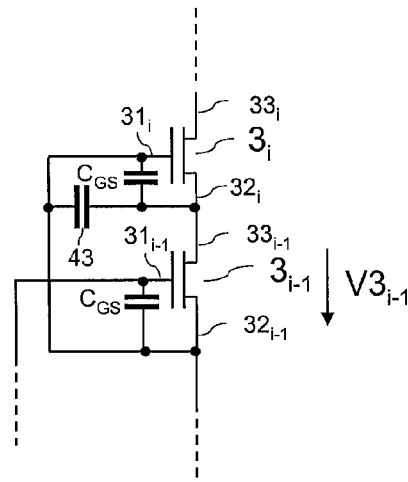
FIG. 7 illustrates a series circuit with two second transistors having different gate-source capacitances.

Referring to FIG. 7, the gate-source capacitance of at least one second transistor 3, such as the upper second transistor $3_i$ of FIG. 7, is higher than the gate-source capacitances $C_{GS}$ of others of the second transistors, such as the lower second transistor $3_{i-1}$ of FIG. 7. The switching speed of the upper transistor $3_i$ can therefore be decreased. The gate-source capacitance $C_{GS}$ of the upper second transistor $3_i$ is increased by connecting an additional capacitance 43 in parallel with the internal gate-source capacitance $C_{GS}$ of the upper transistor $3_i$. While the gate-source capacitance $C_{GS}$ of the lower transistor $3_{i-1}$ only includes the internal gate-source capacitance $C_{GS}$, the gate-source capacitance Ccs of the upper second transistor $3_i$ includes the internal gate-source capacitance $C_{GS}$ and the additional capacitance 43.

Figure 8:
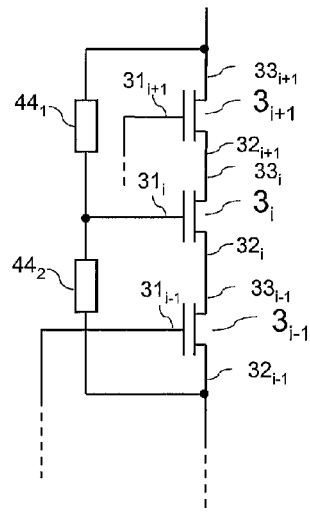
FIG. 8 illustrates a series circuit with several second transistors and with one second transistor that is driven through a resistive voltage divider.
Figure 9:
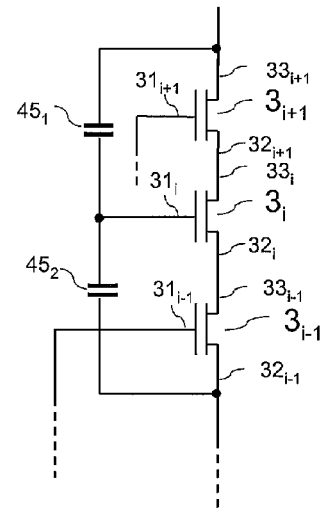
FIG. 9 illustrates a series circuit with several second transistors and with one second transistor that is driven through a capacitive voltage divider.

Referring to FIGS. 8 and 9 the switching speed of one second transistor 3, such as, for example, second transistor $3_i$ of FIGS. 8 and 9, can be influenced relative to the switching speeds of others of the second transistors 3 by driving the gate terminal $31_i$ of the second transistor $3_i$ via an output of a voltage divider with voltage divider elements. Referring to FIG. 8, the voltage divider can for example be a resistive voltage divider, with first and second resistive voltage elements $44_1$, $44_2$ implemented as resistors. Referring to FIG. 9, the voltage divider can be also a capacitive voltage divider, with first and second voltage divider elements implemented as capacitors $45_1$, $45_2$. The voltage divider is connected for example between the first load terminal $32_{i-1}$ of the lower transistor $3_{i-1}$ and the second load terminal $33_{i+1}$ of second transistor $3_{i+1}$ and the center (tap) is connected to the first load terminal $31_i$ of second transistor $3_i$.

Figure 10:
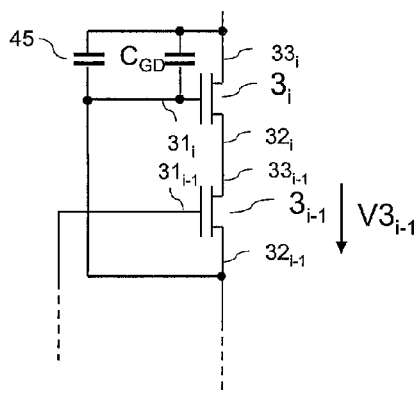
FIG. 10 illustrates a series circuit with two second transistors having different gate-drain capacitances.

Further device characteristics that can be modified in order to influence the switching speed of individual second transistors 3 are, for example, the gatedrain-capacitance or the drain-source capacitance. This is explained with reference to FIGS. 10 and 11 below. FIG. 10 again illustrates a series circuit with two second transistors $3_i$, $3_{i-1}$ (upper and lower transistors). Each second transistor 3 has an internal gate-drain-capacitance $C_{GD}$. The internal gate-drain-capacitance $C_{GD}$ of the upper second transistor $3_i$ is schematically illustrated in FIG. 10. During switching operations of the second transistors 3 not only the gate-source-capacitance $C_{GS}$ (see FIGS. 6 and 7) are charged or discharged, but also the gate-drain-capacitances $C_{GD}$ are charged and discharged, where the gate-drain-capacitance $C_{GD}$ of a second transistor 3 is charged when the transistor 3 is switched off and is almost discharged when the transistor is on. Thus, the switching speed of one individual second transistor 3 can be varied by varying the gate-drain-capacitance. An individual second transistor 3 switches slower when the overall gate-drain-capacitance is increased. Referring to FIG. 10, this gate-drain-capacitance can be increased by connecting an additional capacitance 45 in parallel with the internal gate-drain-capacitance $C_{GD}$.

Figure 11:
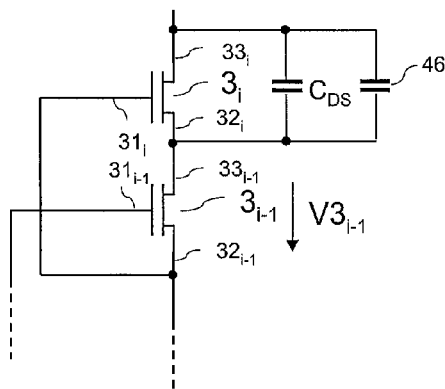
FIG. 11 illustrates a series circuit with two second transistors having different drain-source capacitances.

Referring to FIG. 11, the upper second transistor $3_i$ has a drain-source capacitance $C_{DS}$ between the drain terminal $32_i$ and the source terminal $33_i$ (the corresponding drain-source capacitance of the lower transistor $3_{i-1}$ is not illustrated in FIG. 11). The drain-source capacitance $C_{DS}$ is charged when the upper second transistor $3_i$ is switched off, so that the load voltage increases, and is discharged when the upper second transistor $3_i$ is switched off, so that the load voltage decreases. The drain-source capacitance $C_{DS}$ of the upper second transistor $3_i$ influences its switching speed. The switching speed of the upper second transistor $3_i$ can be reduced by connecting an additional capacitance 46 in parallel with the internal drain-source-capacitance $C_{DS}$, which means by increasing the overall drain-source capacitance.

In order to illustrate how the gate-source-capacitance $C_{GS}$, the gate-drain-capacitance $C_{GD}$ or the drain-source-capacitance $C_{DS}$ can be increased, additional capacitances 43, 45, 46 are illustrated in FIGS. 7, 10 and 11, respectively. However, this is only illustrative. The overall gate-source capacitance, gate-drain-capacitance or drain-source-capacitance not necessarily includes two capacitances connected in parallel. Instead, a plurality of different means can be applied in order to increase these capacitances relative to the corresponding capacitances of others of the second transistors 3.

FIG. 12 schematically illustrates a possible implementation of a second transistor 3 implemented as a depletion MOSFET in order to explain further device characteristics that can be modified in order to influence the switching behavior of the transistor. Referring to FIG. 12, the second transistor 3 includes a source region 53, a drain region 54 and a body region 55 between the source region 53 and the drain region 54. In a depletion MOSFET, the source region 53, the drain region 54 and the body region 55 have the same doping type. In an n-type depletion MOSFET, these semiconductor regions are n-doped, while these semiconductor regions are p-doped in a p-type depletion MOSFET. The depletion MOSFET further includes a gate electrode 56 adjacent the body region 55 and dielectrically insulated from the body region 55 by a gate dielectric 57. In the embodiment illustrated in FIG. 12, the gate electrode 56 is adjacent opposite sides of the body regions 55.

The source region 53 is connected to the source terminal 32 (first load terminal), the drain region 54 is connected to the drain terminal 33 (second load terminal), and the gate electrode 56 is connected to the gate terminal 31 (control terminal). These terminals are only schematically illustrated in FIG. 12.

The operating principle of the depletion MOSFET of FIG. 12 is as follows. When a voltage is applied between the drain 33 and source terminals 32 and when the gate electrode 56 is unbiased, which means when the electrical potential of the gate electrode 56 corresponds to the electrical potential at the source terminal 32, a current flows between the drain 33 and source terminals 32 through the drain region 54, the body region 55 and the source region 53. When the gate electrode 56 is negatively biased relative to the electrical potential of the source terminal 32 in an n-type transistor or is positively biased relative to the electrical potential at the source terminal 32 in a p-type transistor, a depletion region forms in the body region 55 adjacent the gate dielectric 57. The depletion MOSFET is switched off, when the depletion region completely pinches off the conducting channel between the source region 53 and the drain region 54 in the body region 55. The gate-source voltage at which the transistor 3 pinches off, is the pinch-off voltage of the transistor 3. This pinch-off voltage is dependent on several parameters.

The pinch-off voltage is dependent on a thickness d1 of the gate dielectric 57, where the magnitude of the pinch-off voltage increases when the thickness of the gate dielectric 57 increases. The pinch-off voltage is also dependent on the doping concentration of the body region 55, where the magnitude of the pinch-off voltage increases, when the doping concentration of the body region 55 increases.

Further, the pinch-off voltage is dependent on a thickness d2 of the body region 55 between the two opposing sections of the gate electrode 56. When the second transistor 3 is implemented as a FINFET, which is be explained with reference to FIGS. 14 and 15 below, the thickness d2 of the body region 55 corresponds to a thickness of a semiconductor fin. The pinch-off voltage increases when the thickness d2 of the body region 55 increases.

According to one embodiment, the pinch-off voltage of at least one second transistor 3 is different from the pinch-off voltage of others of the second transistors 3. Referring to the explanation before, the pinch-off voltage can be varied by varying the thickness d1 of the gate dielectric 57, the thickness d2 of the body region 55, or by varying the doping concentration of the body region 55.

A further parameter that can be varied in order to influence the switching behavior of the switching transistor 3 is the length L of the body region 55 and the width W of the body region 55. The "length L of the body region" 55 corresponds to the distance between the source region 53 and the drain region 54. The "width W of the body region" 55 is the dimension of the body region in a direction perpendicular to the plane illustrated in FIG. 12. By varying the width W and/or by varying the length L the gate-source capacitance and the gate-drain capacitance can be varied, where theses capacitances are increased, when at least one of these parameters increases. According to one embodiment, at least one of the length L and the width W of one of the second transistors 3 is different from the corresponding parameter in another second transistor 3.

The transistor 3 of FIG. 12 may further include a bulk terminal. The bulk terminal is a terminal of a semiconductor region adjoining the body region 55. This semiconductor region can be a semiconductor substrate. When the transistor is implemented as a FINFET (as illustrated in FIGS. 14 and 15) the bulk terminal can be a terminal contacting a substrate on which the transistor is implemented or can be connected from above the body region 55 as drawn.

According to one embodiment, a biasing voltage can be applied to the bulk terminal. The biasing voltage applied to the bulk terminal influences the pinch-off voltage, wherein the pinch-off voltage decreases when the biasing voltage increases. According to one embodiment, the bulk terminal biasing voltage of at least one second transistor 3 is different from the bulk terminal biasing voltage of others of the second transistors 3.

Referring to the explanation above, the switching behavior of each of the second transistors 3 can be varied or adjusted by adjusting one of the device characteristics explained above. According to one embodiment, the 1st second transistor $3_1$ and the n-th second transistor $3_n$ are implemented such that they have at least one device characteristic that is different from the corresponding device characteristic of others of the second transistors 3.

FIG. 13 illustrates a further embodiment of a semiconductor device arrangement 1. The semiconductor device arrangement 1 of FIG. 12 is based on the semiconductor device arrangement 1 of FIG. 1 and further includes a third load terminal 13' connected to a tap between two load paths of two second transistors ($3_2$, $3_3$ in the embodiment of FIG. 13). Referring to the explanation provided with reference to FIG. 2, the semiconductor device arrangement 1 can be used as an electronic switch for switching a load connected in series with the semiconductor device arrangement 1. Dependent on the amplitude of the voltage that is to be switched, the second load terminal 13 or the third load terminal 13' can be used to connect the semiconductor device arrangement 1 to a terminal for a supply potential or to the load, respectively. When, for example, the supply voltage or the load voltage is a low voltage, the third load terminal 13' is used, while the second load terminal 13 is used when the supply voltage is a high voltage. In the first case, those second transistors 3 that are between the second load terminal 13 and the tap connected to the third circuit node are bypassed. How many second transistors 3 are bypassed is dependent on where the third load terminal 13' connected to the arrangement 30 with the second transistors 3. Bypassing several second transistors 3 decreases the voltage blocking capability of the semiconductor device arrangement 1. However, the on-resistance of the devices that are active between the first load terminal 12 and the third load terminal 13' is lower than the on-resistance of the devices between the first load terminal 12 and the second load terminal 13.

According to a further embodiment (illustrated in dashed lines in FIG. 13), the third load terminal 13' is permanently connected to the second load terminal 13. This is equivalent to having only the second load terminal 13 instead of the second and third load terminals 13, 13'. In this embodiment, a switch 35 is connected between the second load terminal 13 (the third load terminal 13'). This switch 35 can be a low ohmic mechanical switch (relays) or a semiconductor switch and serves to bypass the second transistors 3 between the second load terminal 13 and the tap when a low voltage is applied to the second load terminal 13.

The voltage blocking capability of the switch 35 corresponds to the voltage blocking capability of the series circuit of bypassed second transistors ($3_3$, $3_n$), but may have a lower on resistance than this series circuit. However, the switch 35 need not be optimized in terms of switching losses, switching speed, or the like, since this switch 35 is usually switched on and off at very low frequencies.

According to a further embodiment, a fuse is implemented instead of the switch 35. In this embodiment, the semiconductor arrangement can be configured once to be operated at high voltage (when the fuse is blown and second transistors are not bypassed), or to be operated at a low voltage (when the fuse is active so that some second transistors are bypassed).

The first semiconductor device 2 and the second semiconductor devices (second transistors) 3 that are represented by circuit symbols in the figures explained above can be implemented in many different ways. Some illustrative embodiments for implementing the second transistors 3 are explained with reference to Figures below.

FIG. 14A shows a perspective view of one second transistor 3. FIG. 14B shows a vertical cross sectional view and FIG. 14C shows a horizontal cross sectional view of this second transistor 3. FIGS. 14A, 14B, 14C only show that section of the semiconductor body 100 in which the second transistor 3 is implemented. Active regions of the first semiconductor device 2 and active regions of neighbouring second transistors 3 are not shown. The second transistor 3 according to FIGS. 14A to 14C is implemented as a MOSFET, specifically as a FINFET, and includes a source region 53, a drain region 54 and a body region 55 that are each arranged in a fin-like semiconductor section 52, which will also be referred to as "semiconductor fin" in the following. The semiconductor fin 52 is arranged on a substrate 51. In a first horizontal direction, the source and drain regions 53, 54 extend from a first sidewall $52_2$ to a second sidewall $52_3$ of the semiconductor fin 52. In a second direction perpendicular to the first direction the source and drain regions 53, 54 are distant from one another and are separated by the body region 55. The gate electrode 56 (illustrated in dashed lines in FIG. 14A) is dielectrically insulated from the semiconductor fin 52 by a gate dielectric 57 and is adjacent to the body region 55 on the sidewalls $52_2$, $52_3$ and on a top surface $52_1$ of the semiconductor fin 52.

FIGS. 15A to 15C illustrate a further embodiment of one second transistor 3 implemented as a FINFET. FIG. 15A shows a perspective view, FIG. 15B shows a vertical cross sectional view in a vertical section plane E-E, and FIG. 15C shows a horizontal cross sectional view in horizontal section plane D-D. The vertical section plane E-E extends perpendicular to the top surface $52_1$ of the semiconductor fin 52 and in a longitudinal direction of the semiconductor fin 52. The horizontal section plane D-D extends parallel to the top surface $52_1$ of the semiconductor fin. The "longitudinal direction" of the semiconductor fin 52 corresponds to the second horizontal direction and is the direction in which the source and drain region 53, 54 are distant from one another.

The transistor 3 according to FIGS. 15A to 15C is implemented as a U-shape-surround-gate-FINFET. In this transistor, the source region 53 and the drain region 54 extend from the first sidewall $52_2$ to the second sidewall $52_3$ of the semiconductor fin 52 in the first horizontal direction, and are distant from one another in the second horizontal direction (the longitudinal direction of the semiconductor fin 52) that is perpendicular to the first horizontal direction. Referring to FIGS. 15A and 15B, the source region 53 and the drain region 54 are separated by a trench which extends into the body region 55 from the top surface $52_1$ of the semiconductor fin 52 and which extends from sidewall $52_2$ to sidewall $52_3$ in the first horizontal direction. The body region 55 is arranged below the source region 53, the drain region 54 and the trench in the semiconductor fin 52. The gate electrode 56 is adjacent to the body region 55 in the trench and along the sidewalls $52_2$, $52_3$ of the semiconductor fin 52 and is dielectrically insulated from the body region 55 and the source and drain regions 53, 54 by the gate dielectric 57. In an upper region of the trench, which is a region in which the gate electrode 56 is not arranged adjacent to the body region 55, the gate electrode 56 can be covered with an insulating or dielectric material 58.

The second transistors 3 of FIGS. 14A to 14C and of FIGS. 15A to 15C are, for example, implemented as depletion transistors, such as n-type or p-type depletion transistors. In this case, the source and drain regions 53, 54 and the body region 55 have the same doping type. The body region 55 usually has a lower doping concentration than the source and drain regions 53, 54. The doping concentration of the body region 55 is, e.g., about 2E18 $cm^{-3}$. In order to be able to completely interrupt a conducting channel in the body region 55 between the source region 53 and the drain region 54, the gate electrode 56 along the sidewalls $52_2$, $52_3$ of the semiconductor fin 52 completely extends along the semiconductor fin 52 in the second horizontal direction (the longitudinal direction). In the vertical direction the gate electrode 56 along the sidewalls $52_2$, $52_3$ extends from the source and drain regions 53, 54 to at least below the trench.

Referring to FIGS. 14A and 15A, the source region 53 is connected to the first load terminal (source terminal) 32, the drain region 54 is connected to the second load terminal (drain terminal) 33, and the gate electrode 56 is connected to the control terminal (gate terminal) 31. These terminals are only schematically illustrated in FIGS. 14A and 15A.

A thickness of the semiconductor fin 52, which is the dimension of the semiconductor fin in the first horizontal direction, and the doping concentration of the body region 55 are adjusted such that a depletion region controlled by the gate electrode 56 can extend from sidewall $52_2$ to sidewall $52_3$ in order to completely interrupt a conducting channel between the source and the drain region 53, 54 and to switch the second transistor 3 off. In an n-type depletion MOSFET a depletion region expands in the body region 55 when a negative control (drive) voltage is applied between the gate electrode 56 and the source region 53 or between the gate terminal 31 and the source terminal 32, respectively. Referring to the explanation provided with reference to FIG. 1, this drive voltage is dependent on the load voltage of the first semiconductor device 2, or is dependent on the load voltage of another one of the second transistors 3. How far the depletion region expands perpendicular to the sidewalls $52_2$, $52_3$ is also dependent on the magnitude of the control voltage applied between the gate terminal 31 and the source terminal 32. Thus, the thickness of the semiconductor fin 52 and the doping concentration of the body region 55 are also designed dependent on the magnitude of the control voltage that can occur during the operation of the semiconductor device arrangement 1.

Implementing the FINFETs illustrated in FIGS. 14A to 14C and 15A to 15C as a U-shape-surround-gate-FINFET, in which the channel (body region) 55 has a U-shape and the gate electrode 56 is also arranged on the sidewalls $52_2$, $52_3$ and on a top surface $52_1$ of the semiconductor fin 52 is only an example. These FINFETs could also be modified (not illustrated) to have the gate electrode 56 implemented with two gate electrode sections arranged on the sidewalls $52_2$, $52_3$ but not on the top surface $52_1$ of the semiconductor fin 52. A FINFET of this type can be referred to as double-gate FINFET. Each of the FINFETs explained above and below can be implemented as a U-shape-surround-gate-FINFET or as a double-gate FINFET. It is even possible to implement the individual second transistors 3 as different types of MOSFETs or FINFETs in one integrated circuit.

Each of the second transistors 3 and the first semiconductor device 2 can be implemented as a FINFET. These individual FINFETs can be implemented in different ways to form the semiconductor arrangement 1.

FIG. 16 illustrates a vertical cross sectional view of a semiconductor fin 52 in which active regions (source, drain and body regions) of a first semiconductor device 2 and of n second transistors 3 are arranged. In this embodiment, the first semiconductor device 2 and the second transistors 3 are implemented as U-shape-surround-gate FINFETs or as double-gate FINFETs. In FIG. 16, like reference numbers are used to denote like features as in FIGS. 14A to 14C and 15A to 15C. In FIG. 16 the reference numbers of like features of the different second transistors $3_1$-$3_n$ have different indices (1, 2, 3, n).

Referring to FIG. 16, the active regions of neighboring second transistors 3 are insulated from each other by dielectric layers 59 which extend in a vertical direction of the semiconductor fin 52. These dielectric layers 59 may extend down to or down into the substrate 51. Further, the dielectric layers 59 extend from sidewall to sidewall of the semiconductor fin 52. However, this is out of view in FIG. 16. The active regions of the first semiconductor device 2 are dielectrically insulated from active regions of the 1st second transistor $3_1$ by a further dielectric layer 66 that also extends in a vertical direction of the semiconductor fin 52. In the first semiconductor device 2, a source region 61 and a drain region 62 are separated by a body region 63. The gate electrode 64 that is arranged in the trench (and the position of which at the sidewalls of the semiconductor fin is illustrated by dotted lines), extends from the source region 61 along the body region 63 to the drain region 62. The source region 61 is connected the first load terminal 22 that forms the first load terminal 12 of the semiconductor arrangement 1, the drain region 62 is connected to the second load terminal 23, and the gate electrode 64 is connected to the control terminal 21 that forms the control terminal 11 of the semiconductor arrangement 1. The body region 63 is also connected to the first load terminal 22.

The first semiconductor device 2 is, for example, implemented as an enhancement MOSFET. In this case, the body region 63 is doped complementarily to the source and drain regions 61, 62. In an n-type MOSFET, the source and drain regions 61, 62 are n-doped while the body region 63 is p-doped, and in a p-type MOSFET, the source and drain regions 61, 62 are p-doped while the body region 63 is n-doped.

According to one embodiment, the substrate 51 is doped complementarily to the active regions of the second transistors 3 and to the source and drain regions 61, 62 of the first semiconductor device 2. In this case, there is a junction isolation between the individual second transistors 3. According to a further embodiment (illustrated in dashed lines), the substrate 51 is an SOI (silicon-oninsulator) substrate and includes a semiconductor substrate $51_1$ and an insulation layer $51_2$ on the semiconductor substrate $51_1$. The semiconductor fin 52 is arranged on the insulation layer $51_2$. In this embodiment, there is a dielectric layer between the individual second transistors 3 in the substrate 51.

According to yet another embodiment, illustrated in FIG. 17, the substrate 51 has the same doping type as the active regions of the second transistors 3 and as the source and drain regions 61, 62 of the first semiconductor device 2. In this embodiment, the gate electrode 64 of the first semiconductor device 2 extends to the substrate 51, so that there is a conducting path in the body region 63 between the source region 61 and the substrate 51 when the first semiconductor device 2 is in the on-state. Further the substrate 51 is connected to the second load terminal 13 of the semiconductor arrangement 1 through a contact region 67 of the same doping type as the substrate 51. The contact region 67 is more highly doped than the substrate 51 and extends from the first surface $52_1$ of the semiconductor fin 52 to the substrate 51. The contact region 67 may adjoin the drain region $54_n$ of the n-th second transistor 3. The contact region 67 is optional. A connection between the second load terminal 13 and the substrate 51 could also be provided through the drain and body regions $54_n$, $55_n$ of the second transistor $3_n$.

In the semiconductor arrangement of FIG. 17, the substrate 51 forms a current path that is parallel to the current path through the second transistors 3 or that is parallel to the ADZ. The substrate 51 is similar to the drift region in a conventional power transistor. In this embodiment, the body regions 55 of the individual second transistors 3 are coupled to the drift region 51.

According to further embodiment (illustrated in dashed lines in FIG. 17) the substrate 51 includes a semiconductor layer $51_3$ doped complementary to remaining sections of the substrate 51 and to the body regions 55 of the second transistors 3. This layer $51_3$ is arranged between the body regions 55 of the second transistors 3 and those sections of the substrate 51 acting as a drift region and provides a junction insulation between the individual second transistors 3 in the substrate 51.

The semiconductor arrangement 1 of FIG. 3 with the diode 2 connected in series with the second transistors 3 can easily be obtained from the arrangements illustrated in FIGS. 14 and 15 by either connecting the control terminal of the first semiconductor device 2 to the first load terminal 22 or by letting the control terminal 21 float. In this case, only the body diode of the MOSFET, which is the diode formed by the pn-junction between the body region 63 and the drain region 65 is active between the first and second load terminals 22, 23 of the second semiconductor device 3.

Each of the first semiconductor device 2 and the second transistors 3 (referred to as devices in the following) may include a plurality of identical cells (transistor cells) that are connected in parallel. Each of these cells can be implemented like the first semiconductor device 2 or like the second transistors 3, respectively, illustrated in FIGS. 14 and 15. Providing a plurality of cells connected in parallel in one device can help to increase the current bearing capability and to reduce the on-resistance of the individual device.

FIG. 18 illustrates a top view of a semiconductor arrangement according to a first embodiment which includes a first semiconductor device 2 and a plurality of second transistors 3, with each of these devices having a plurality (from which three are illustrated) cells connected in parallel. The individual cells of one device are implemented in different semiconductor fins $52_I$, $52_{II}$, $52_{III}$. Each of these cells has a source region 61, 53 that is additionally labeled with "S" in FIG. 18, and a drain region 62, 54 that is additionally labeled with "D" in FIG. 18. The cells of one device are connected in parallel by having the source regions of the one device connected together and by having the drain regions of the one device connected together. These connections as well as connections between the load terminals of the different devices are schematically illustrated in bold lines in FIG. 18. Connections between the control terminals (gate terminals) and the load terminals of the different devices are not illustrated in FIG. 18. The connections between the cells and the different devices can be implemented using conventional wiring arrangements arranged above the semiconductor body and contacting the individual active regions (source and drain regions) through vias. Those wiring arrangements are commonly known so that no further explanations are required in this regard. The individual cells of one device 2, $3_1$, $3_2$, $3_3$, $3_n$ have a common gate electrode 64, $56_1$, $56_2$, $56_3$, $56_n$ arranged in the U-shaped trenches of the individual semiconductor fins and in trenches between the individual fins. These "trenches between the fins" are longitudinal trenches along the fins. All gates 64, $56_1$, $56_2$, $56_3$, $56_n$ are electrically isolated from each other by a dielectric 66 and 59.

FIG. 19 illustrates a further embodiment for implementing one second transistor 3 with a plurality of transistor cells. In this embodiment, a plurality of transistor cells of the second transistor 3 are implemented in one semiconductor fin 52. In the longitudinal direction of the semiconductor fin 52, source and drain regions 53, 54 are arranged alternatingly with a source region 53 and a neighboring drain region 54 being separated by one (U-shaped) trench that accommodates the gate electrode 56. The source regions 53 are connected to the first load terminal 22, and the drain regions 54 are connected to the second load terminal 23, so that the individual transistor cells are connected in parallel. The gate electrode 56 is common to the individual transistor cells and extends along the sidewalls of the semiconductor fin 52 in the longitudinal direction. Each source region 53 and each drain region 54 (except for the source and drain regions arranged at the longitudinal ends of the semiconductor fin 52) is common to two neighboring transistor cells.

The concept of providing several transistor cells in one semiconductor fin explained with reference to FIG. 19 is, of course, also applicable to the implementation of the first semiconductor device 2.

Referring to FIGS. 20A to 20C, one second transistor 3 may include a plurality of semiconductor fins $52_{IV}$, $52_V$, $52_{VI}$, $52_{VII}$, with each semiconductor fin $52_{IV}$-$52_{VII}$ including a plurality of transistor cells (one of these cells is highlighted by a dashed and dotted frame in FIG. 20A). FIG. 20A shows a top view of one second transistor 3, FIG. 20B shows a vertical cross sectional view in a section plane F-F cutting through source regions 53 in different fins, and FIG. 20C shows a vertical cross sectional view in a section plane G-G cutting through the trenches with the gate electrode 56 in different fins. Referring to FIG. 20A, the source regions 53 of the individual transistor cells are connected to the first load terminal 22 and the drain regions 54 of the individual transistor cells are connected to the second load terminal 23 so that the individual transistor cells are connected in parallel. These connections are only schematically illustrated in FIG. 20A.

The concept of providing a plurality of semiconductor fins with each semiconductor fin including a plurality of transistor cells explained with reference to FIGS. 20A to 20C is, of course, also applicable to the implementation of the first semiconductor device 2.

Although only 20 transistor cells are illustrated in FIG. 20A, namely five cells in each of the four semiconductor fins $52_{IV}$-$52_{VII}$, one second transistor 3 or the first semiconductor device 2 may include up to several thousand or even up to several ten or several hundred million transistor cells connected in parallel. The individual transistor cells form a matrix of transistor cells that are connected in parallel. A device (first semiconductor device 2 or second transistor 3) having a plurality of transistor cells arranged in a matrix will be referred to as matrix device in the following.

FIG. 21 illustrates how second transistors 3 implemented as matrix devices can be connected in series. For illustration purposes, only two second transistors $3_i$, $3_{i+1}$ are shown in FIG. 21. For connecting these two transistors in series, the source regions 53 of the second transistor $3_{i+1}$ are connected to the drain regions 54 of the transistor $3_i$. The source regions 53 of the second transistor $3_i$ are connected to the drain regions 54 of second transistors $3_{i-1}$ (not illustrated), and the drain regions 54 of the second transistor $3_{i+1}$ are connected to the source regions 53 of second transistors $3_{i+2}$ (not illustrated).

Referring to the explanation before, each of the individual transistors in the series circuit with the first transistor 2 and the second transistors 3 can be implemented with a plurality of transistor cells. According to one embodiment, the semiconductor device arrangement is partitioned such that there are several series circuits, each including a first transistor and a plurality of second transistors, connected in parallel. A semiconductor arrangement partitioned in this way is schematically illustrated in FIG. 22.

In FIG. 22, reference characters $1_1$, $1_2$, $1_p$ denote the individual series circuits connected in parallel. The first transistors of the individual series circuits $1_1$, $1_2$, $1_p$ have separate gate terminals $11_1$, $11_2$, $11_p$ that are connected to the control terminal 11 (main control terminal) of the overall arrangements. Gate resistors R1, R2, Rp are connected between the gate terminals $11_1$, $11_2$, $11_p$ and the main control terminal 11. Through these gate resistors R1, R2, Rp the start of switching of the first transistors of the individual series circuits can be adjusted, where the start of switching of one transistor is delayed when the corresponding resistor increases, and vice versa. According to one embodiment, these gate resistors are different, in order switch the individual series circuits into the on-state or the off-state subsequently. This can be helpful in terms of reducing overall di/dt and therefore EMI. Optionally, capacitors C1, C2, Cp are connected between the gate terminals $11_1$, $11_2$, $11_p$ and the common source 12. These capacitors are connected in parallel to the gate-source capacitances (not shown) of the first transistors in the individual series circuits. Through theses additional capacitors C1, C2, Cp, the start of switching for each series circuit $1_1$, $1_2$, $1_p$ can also be adjusted, where the start of switching can be delayed when the corresponding capacitor increases. According to one embodiment, the individual capacitors C1, C2, Cp are mutually different. In each case one resistor R1, R2, Rp and one capacitor C1, C2, Cp form an RC element, so that the gate terminals $11_1$, $11_2$, $11_p$ are coupled to the main control terminal (drive terminal) 11 via one RC element. The resistors R1, R2, Rp and the capacitors are designed such that at least two of these RC elements have different time constants.

According to a further embodiment, the resistors R1, R2, Rp are omitted and the switching speed is only varied by variation of the capacitors C1, C2, Cp.

The invention claimed is:

1. A semiconductor device arrangement, comprising:
a first semiconductor device having a load path;
a plurality of second semiconductor devices, each having a load path between a first and a second load terminal and a control terminal;
wherein the second semiconductor devices have their load paths connected in series and connected in series to the load path of the first semiconductor device;
wherein each of the second semiconductor devices has its control terminal connected either to one of the first and second load terminals of one of the other second semiconductor devices or to one load terminal of the first semiconductor device;
wherein each of the second semiconductor devices has at least one device characteristic; and
wherein at least one device characteristic of at least one of the second semiconductor devices is different from the corresponding device characteristic of others of the second semiconductor devices.

2. The semiconductor device arrangement of claim 1, wherein the second semiconductor devices are MOSFETs, MISFETs, MESFETs, FINFETs, JFETs, HEMTs, IGBTs or nanotube devices and wherein the at least one device characteristic is selected from: a gate resistance; a threshold voltage; a gate-source capacitance; a gate-drain capacitance; a drain-source capacitance; a channel width; a body thickness; a channel length; a gate oxide thickness;
and a doping concentration of one a source region, a body region and a drain region.

3. The semiconductor device arrangement of claim 1, wherein the first semiconductor device is a transistor.

4. The semiconductor device arrangement of claim 3, wherein the transistor is a normally-off transistor.

5. The semiconductor device arrangement of claim 1, wherein the second semiconductor devices are normally-on transistors.

6. The semiconductor device arrangement of claim 1, wherein one of the second semiconductor devices that has its load path directly connected to the load path of the first semiconductor device has its control terminal connected to a first load terminal of the first semiconductor device; and
wherein each of the other second semiconductor devices has its control terminal connected to a first load terminal of another second semiconductor device.

7. The semiconductor device arrangement of claim 6, wherein each of the other second semiconductor devices has its control terminal connected to a first load terminal of an adjacent second semiconductor device.

8. The semiconductor device arrangement of claim 6, wherein a resistor is connected between the control terminal of the at least one second semiconductor device and the first load terminal of another second semiconductor device.

9. The semiconductor device arrangement of claim 8, wherein a rectifier element is connected in parallel with the resistor.

10. The semiconductor device arrangement of claim 1, wherein a capacitor is connected between the control terminal and the first load terminal of the at least one second semiconductor device, the capacitor being additionally to a gate-source capacitance of the at least one second semiconductor device.

11. The semiconductor device arrangement of claim 1, wherein the first semiconductor device is one of an n-channel or p-channel transistor.

12. The semiconductor device arrangement of claim 11, wherein the second semiconductor devices are one of n-channel or p-channel transistors.

13. The semiconductor device arrangement of claim 1, wherein the second semiconductor devices are FINFETs, each comprising:
 at least one semiconductor fin;
 a source region, a body region and a drain region arranged in the at least one semiconductor fin, with the body region being arranged between the source region and the drain region; and
 a gate electrode arranged adjacent to the body region and dielectrically insulated from the body region by a gate dielectric.

14. A semiconductor device arrangement, comprising:
 a first semiconductor device having a load path;
 a plurality of second semiconductor devices, each having a load path between a first and a second load terminal and a control terminal, wherein the second semiconductor devices have their load paths connected in series and connected in series to the load path of the first semiconductor device, thereby forming a first series circuit, wherein the first series circuit is connected between a first load terminal and a second load terminal of the semiconductor device arrangement, and wherein each of the second semiconductor devices having its control terminal connected either to the load terminal of one of the other second semiconductor devices or to one of the load terminals of the first semiconductor device such that one of the second semiconductor devices receives as a drive voltage between its control terminal and one of its first and second load terminals a load path voltage of the first semiconductor device, and the other second semiconductor devices each receive as a drive voltage the load path voltage of at least one second semiconductor device;
 a tap of the first series circuit, the tap located between the load paths of two of the second semiconductor devices;
 a fuse; and
 a third load terminal connected to the second load terminal and coupled to the tap via the fuse.

15. The semiconductor device arrangement of claim 14, further comprising:
 a switching element connected between the third load terminal and the tap, wherein the third load terminal is connected to the second load terminal.

16. The semiconductor device arrangement of claim 15, wherein the switching element is a mechanical switching element, or a semiconductor switching element.

17. The semiconductor device arrangement of claim 14, wherein each of the second semiconductor devices except for a first one of the second semiconductor devices has its control terminal connected to the load terminal of one of the other second semiconductor devices, and wherein the first one of the second semiconductor devices has its control terminal connected to one of the load terminals of the first semiconductor device.

18. A semiconductor device arrangement, comprising:
 at least two series circuits connected in parallel, each series circuit comprising a first semiconductor device having a load path and a control terminal and a plurality of second semiconductor devices, each having a load path between a first and a second load terminal and a control terminal;
 a drive terminal;
 at least one resistor connected between the control terminal of the first semiconductor device of one series circuit and the drive terminal;
 wherein the second semiconductor devices of each series circuit have their load paths connected in series and connected in series to the load path of the first semiconductor device,
 wherein each of the second semiconductor devices of each series circuit has its control terminal connected either to the load terminal of one of the other second semiconductor devices or to one of the load terminals of the first semiconductor device.

19. The semiconductor device arrangement of claim 18, wherein each of the control terminals of the first semiconductor devices is coupled to the drive terminal via a resistor, wherein at least two of these resistors are different.

20. The semiconductor device arrangement of claim 18, wherein the at least one resistor is part of an RC element.

21. The semiconductor device arrangement of claim 18, wherein each of the control terminals of the first semiconductor devices is coupled to the drive terminal via an RC element, wherein at least two of these RC elements have different time constants.

22. The semiconductor device arrangement of claim 18, wherein there are more than 20 second semiconductor devices.

* * * * *

UNITED STATES PATENT AND TRADEMARK OFFICE
CERTIFICATE OF CORRECTION

PATENT NO. : 9,530,764 B2  
APPLICATION NO. : 14/372774  
DATED : December 27, 2016  
INVENTOR(S) : R. Weis et al.

It is certified that error appears in the above-identified patent and that said Letters Patent is hereby corrected as shown below:

In the Claims

Column 22, Line 39 (Claim 2, Line 9) please change "one a" to -- one of a --

Signed and Sealed this  
Fourth Day of April, 2017

Michelle K. Lee  
*Director of the United States Patent and Trademark Office*